United States Patent
Finley et al.

(10) Patent No.: US 10,689,753 B1
(45) Date of Patent: *Jun. 23, 2020

(54) SYSTEM HAVING A COOLING ELEMENT FOR DENSIFYING A SUBSTRATE

(75) Inventors: John E Finley, Liberty Lake, WA (US); Robert A. Fiala, Spokane, WA (US); Mark R. Wolke, Spokane, WA (US); Mark K. Lentz, Spokane Valley, WA (US)

(73) Assignee: Goodrich Corporation, Charlotte, NC (US)

( * ) Notice: Subject to any disclaimer, the term of this patent is extended or adjusted under 35 U.S.C. 154(b) by 920 days.

This patent is subject to a terminal disclaimer.

(21) Appl. No.: 12/427,565

(22) Filed: Apr. 21, 2009

(51) Int. Cl.
  *C23C 16/04* (2006.01)
  *C23C 16/44* (2006.01)
  *B05C 9/14* (2006.01)

(52) U.S. Cl.
  CPC ............. *C23C 16/045* (2013.01); *B05C 9/14* (2013.01); *C23C 16/4412* (2013.01)

(58) Field of Classification Search
  CPC ... C23C 16/045; C23C 8/20; C04B 2235/614; C04B 35/521; Y10S 427/10; F16D 69/023; H01L 21/6719; H01L 21/67201; H01L 21/67207; H01L 21/67236
  USPC ........... 118/715–733; 427/10, 249.2, 255.12, 427/249.3, 900, 294; 264/29.1, 29.2; 442/148, 179; 156/345.25–345.56
  See application file for complete search history.

(56) References Cited

U.S. PATENT DOCUMENTS

| | | | | |
|---|---|---|---|---|
| 2,378,476 A | * | 6/1945 | Guellich | 118/723 VE |
| 2,532,971 A | * | 12/1950 | Van Leer et al. | 427/162 |
| 3,641,973 A | * | 2/1972 | Shrader | 118/719 |
| 3,673,051 A | * | 6/1972 | Clark et al. | 428/195.1 |
| 3,764,371 A | * | 10/1973 | Baldi et al. | 427/253 |
| 3,895,084 A | * | 7/1975 | Bauer | 156/89.26 |
| 3,915,117 A | * | 10/1975 | Schertler | 118/719 |
| 4,103,099 A | * | 7/1978 | Allsopp | 219/76.17 |
| 4,134,360 A | * | 1/1979 | Fisher et al. | 118/728 |
| 4,171,235 A | * | 10/1979 | Fraas et al. | 117/101 |
| 4,212,906 A | * | 7/1980 | Fisher et al. | 427/237 |
| 4,226,208 A | * | 10/1980 | Nishida et al. | 118/706 |
| 4,421,786 A | * | 12/1983 | Mahajan et al. | 117/101 |
| 4,681,773 A | * | 7/1987 | Bean | 427/255.5 |
| 4,832,715 A | * | 5/1989 | Naruse | 96/221 |
| 4,951,603 A | * | 8/1990 | Yoshino et al. | 118/719 |
| 5,062,386 A | * | 11/1991 | Christensen | 118/725 |
| 5,116,562 A | * | 5/1992 | Lang | B29C 43/203 156/59 |
| 5,221,354 A | * | 6/1993 | Rigney | 118/725 |
| 5,264,039 A | * | 11/1993 | Gobush et al. | 118/724 |
| 5,455,071 A | * | 10/1995 | Pillhoefer et al. | 427/253 |
| 5,743,967 A | * | 4/1998 | Kobori et al. | 118/724 |
| 5,895,716 A | | 4/1999 | Fiala et al. | |
| 5,900,297 A | * | 5/1999 | Rudolph et al. | 428/66.2 |
| 5,904,957 A | * | 5/1999 | Christin et al. | 427/248.1 |

(Continued)

*Primary Examiner* — Karl Kurple
(74) *Attorney, Agent, or Firm* — Snell & Wilmer, L.L.P.

(57) ABSTRACT

A process chamber for making composite structures using CVI/CVD is provided. The process chamber has a plurality of compartments. Each compartment has its own equipment such as, for example, a substrate support structure, a gas inlet, a gas outlet, a cooling element and a heating element, and control system for independently controlling the process conditions for treating a substrate contained within.

3 Claims, 11 Drawing Sheets

(56) References Cited

U.S. PATENT DOCUMENTS

| | | | | |
|---|---|---|---|---|
| 5,916,633 A * | 6/1999 | Lackey | C04B 35/83 | |
| | | | 427/228 | |
| 6,083,560 A * | 7/2000 | Fisher et al. | 427/249.2 | |
| 6,097,005 A * | 8/2000 | Akimoto | H01L 21/67109 | |
| | | | 118/724 | |
| 6,109,209 A * | 8/2000 | Rudolph et al. | 118/724 | |
| 6,162,298 A * | 12/2000 | Rudolph | C23C 16/045 | |
| | | | 118/715 | |
| 6,221,155 B1 * | 4/2001 | Keck et al. | 117/200 | |
| 6,257,881 B1 | 6/2001 | Fiala et al. | | |
| 6,352,430 B1 * | 3/2002 | Garn | F27B 5/06 | |
| | | | 118/724 | |
| 6,353,209 B1 * | 3/2002 | Schaper | H01L 21/67103 | |
| | | | 118/725 | |
| 6,383,298 B1 | 5/2002 | Ross et al. | | |
| 6,416,824 B2 * | 7/2002 | Fisher et al. | 427/590 | |
| 6,602,348 B1 * | 8/2003 | Rogelstad | 118/719 | |
| 6,605,319 B1 * | 8/2003 | Chinn et al. | 427/255.28 | |
| 6,639,196 B1 | 10/2003 | Fiala et al. | | |
| 6,828,225 B2 * | 12/2004 | Kondo et al. | 438/622 | |
| 6,846,514 B2 * | 1/2005 | Jonnalagadda | C23C 16/045 | |
| | | | 29/428 | |
| 6,858,087 B2 * | 2/2005 | Hori | C23C 16/4411 | |
| | | | 118/724 | |
| 6,911,234 B2 * | 6/2005 | Warnes et al. | 427/248.1 | |
| 7,241,470 B2 * | 7/2007 | Delperier et al. | 427/8 | |
| 8,084,079 B2 * | 12/2011 | Thebault et al. | 427/8 | |
| 2001/0042744 A1 * | 11/2001 | Tachikawa et al. | 219/444.1 | |
| 2002/0056292 A1 * | 5/2002 | Kamio et al. | 65/424 | |
| 2002/0069970 A1 * | 6/2002 | Noorbakhsh et al. | 156/345.37 | |
| 2003/0047282 A1 * | 3/2003 | Sago | C23C 16/45565 | |
| | | | 156/345.34 | |
| 2003/0136517 A1 * | 7/2003 | Hori | C23C 16/4411 | |
| | | | 156/345.37 | |
| 2003/0152700 A1 * | 8/2003 | Asmussen | C23C 16/0254 | |
| | | | 427/249.8 | |
| 2004/0007181 A1 * | 1/2004 | Yasuno | 118/723 E | |
| 2004/0224110 A1 * | 11/2004 | Jimbo et al. | 428/35.7 | |
| 2008/0078325 A1 * | 4/2008 | Matsuda | C23C 16/0218 | |
| | | | 118/723 HC | |
| 2008/0241377 A1 * | 10/2008 | Faguet | C23C 16/452 | |
| | | | 427/248.1 | |
| 2009/0126631 A1 * | 5/2009 | Liu | 118/719 | |
| 2009/0211525 A1 * | 8/2009 | Sarigiannis et al. | 118/707 | |
| 2009/0239078 A1 * | 9/2009 | Asmussen | C23C 16/274 | |
| | | | 428/408 | |
| 2010/0068417 A1 * | 3/2010 | Neal et al. | 427/596 | |
| 2010/0247809 A1 * | 9/2010 | Neal | 427/596 | |
| 2011/0126762 A1 * | 6/2011 | Faguet | C23C 16/452 | |
| | | | 118/723 ER | |
| 2011/0290175 A1 * | 12/2011 | Paranjpe et al. | 117/85 | |
| 2012/0213929 A1 * | 8/2012 | Lee | C23C 16/44 | |
| | | | 427/255.29 | |
| 2014/0048016 A1 * | 2/2014 | Scarsbrook | C23C 16/274 | |
| | | | 118/723 MW | |
| 2014/0230729 A1 * | 8/2014 | Brandon | C23C 16/274 | |
| | | | 118/723 MW | |
| 2014/0342122 A1 * | 11/2014 | Inglis | C23C 16/01 | |
| | | | 428/141 | |
| 2018/0229464 A1 * | 8/2018 | Neumuller | B65H 29/06 | |

\* cited by examiner

SYSTEM HAVING A COOLING ELEMENT FOR DENSIFYING A SUBSTRATE

FIELD OF INVENTION

This invention generally relates to creating composite structures, and more particularly, to systems and methods for performing CVI/CVD processes to create composite structures.

BACKGROUND OF THE INVENTION

Chemical vapor infiltration and chemical vapor deposition (CVI/CVD) are well-known processes for forming composite materials. In particular, CVI/CVD is a useful process for fabricating structural composites such as brake disks, combustors and turbine components.

In general, the term "chemical vapor infiltration" (CVI) implies deposition of a matrix within the pores of a substrate, and "chemical vapor deposition" (CVD) implies deposition of a surface coating on a substrate. However, as used herein, the term CVI/CVD is intended to refer generally to infiltration and deposition of a matrix on and within a substrate.

CVI/CVD generally includes passing a gas (e.g., methane, propane, etc.) comprising a reactant component (e.g., carbon) around and through a substrate. The reactant component deposits on and within the pores of the substrate to form a composite structure. When the substrate and reactant component both comprise carbon, for example, a carbon/carbon composite material is formed.

In some conventional CVI/CVD processes, several substrates are stacked within a process chamber (i.e., a furnace) in order to increase the number composite structures produced per batch. During treatment, the process conditions (i.e., temperature, pressure and flow rate of the gas) within the chamber are controlled and/or varied to create the desired thermal and pressure gradients and to facilitate the deposition of the matrix within the substrate.

However, there are several disadvantages associated with such conventional systems and methods for performing CVI/CVD. For example, using conventional CVI/CVD processes, the temperature and pressure gradients are likely to vary at different locations within the process chamber causing the rate and amount of deposition of the matrix to vary from substrate to substrate, dependent upon the location of the substrate within the process chamber.

Moreover, the exhaust systems of such conventional CVI/CVD process systems tend to be less efficient and require more power to operate, often resulting in the undesirable formation of soot on the substrates as well as build-up of carbon residue within the process chamber, typically requiring shut down of the system for cleaning and maintenance.

As such, improved systems and methods for performing CVI/CVD that increase uniformity of the composite structures and efficacy of the CVI/CVD process are desired.

SUMMARY OF THE INVENTION

This invention includes process chambers for performing CVI/CVD. In an exemplary embodiment, the process chamber comprises a base, a top portion, and a plurality of compartments. Each compartment may have its own set of controls and process equipment to allow independent control of the treatment conditions within. In some embodiments, each compartment comprises a substrate support structure and various gas inlets and gas outlets for delivering gas into the compartment and/or the substrate support structures.

In an embodiment, the substrate support structure is operable to contain a substrate. Although described herein as "a substrate," one skilled in the art will appreciate there may be more than one substrate in any of the embodiments. Moreover, although referred to as a "substrate" herein, one skilled in the art will appreciate that a "substrate" may also include and/or be referred to as a "preform."

For example, a substrate support structure comprises a cover portion that is operable to mate with a seat portion to form a cavity for containing a substrate. In various embodiments, a substrate support structure may further comprise a seal component, a spacer component and/or a diffuser component.

DETAILED DESCRIPTION

The detailed description of exemplary embodiments herein makes reference to the accompanying drawings, which show exemplary embodiments by way of illustration and its best mode, and not of limitation. While these exemplary embodiments are described in sufficient detail to enable those skilled in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

A process chamber for performing CVI/CVD processes is provided. In accordance with an exemplary embodiment, the process chamber comprises a base, a top portion, and one or more process compartments. The process chamber may further include a heating and/or cooling element. Each or a subset of the compartments may include a gas inlet, a gas outlet, a heating element, a cooling element, and a substrate support structure.

Figure 1:
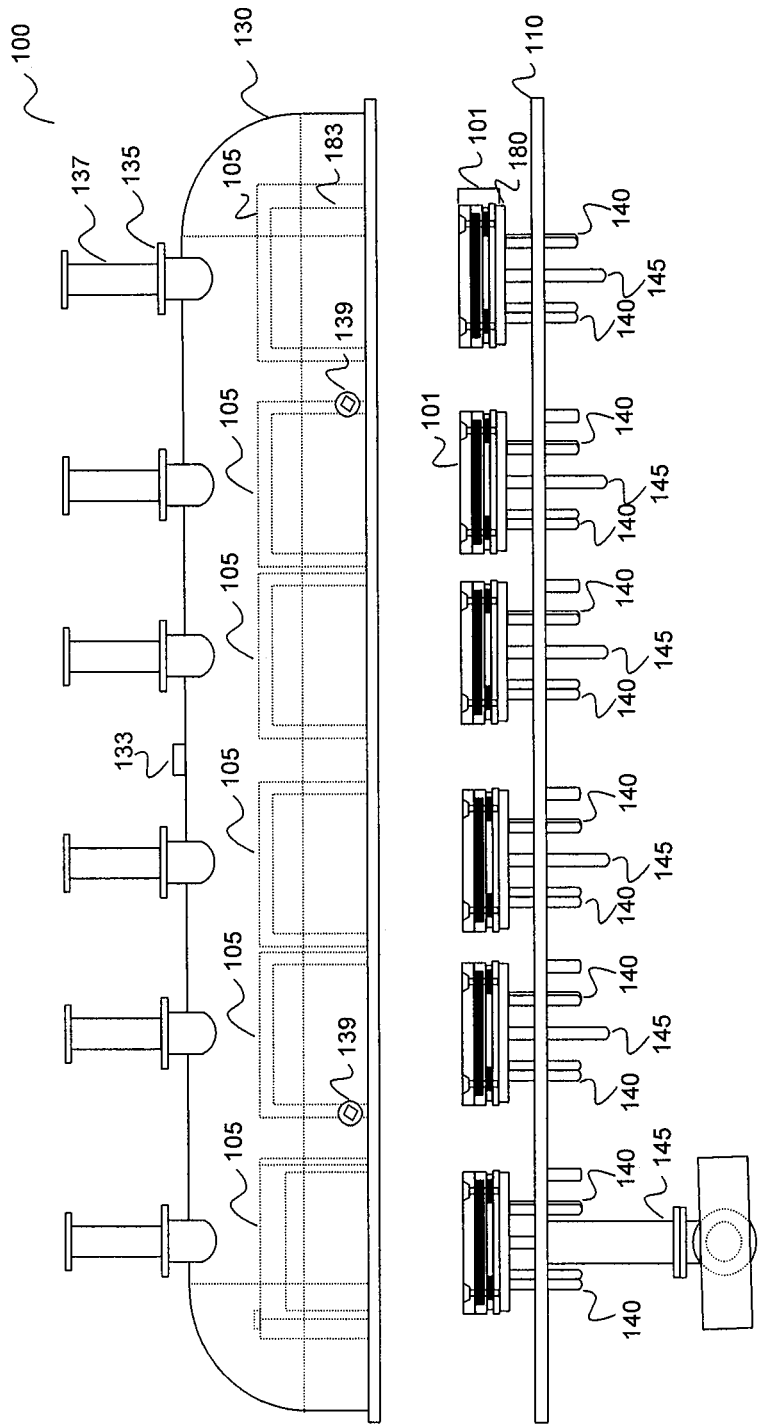
FIG. 1 illustrates an exemplary embodiment of a process chamber comprising a plurality of compartments.
Figure 2:
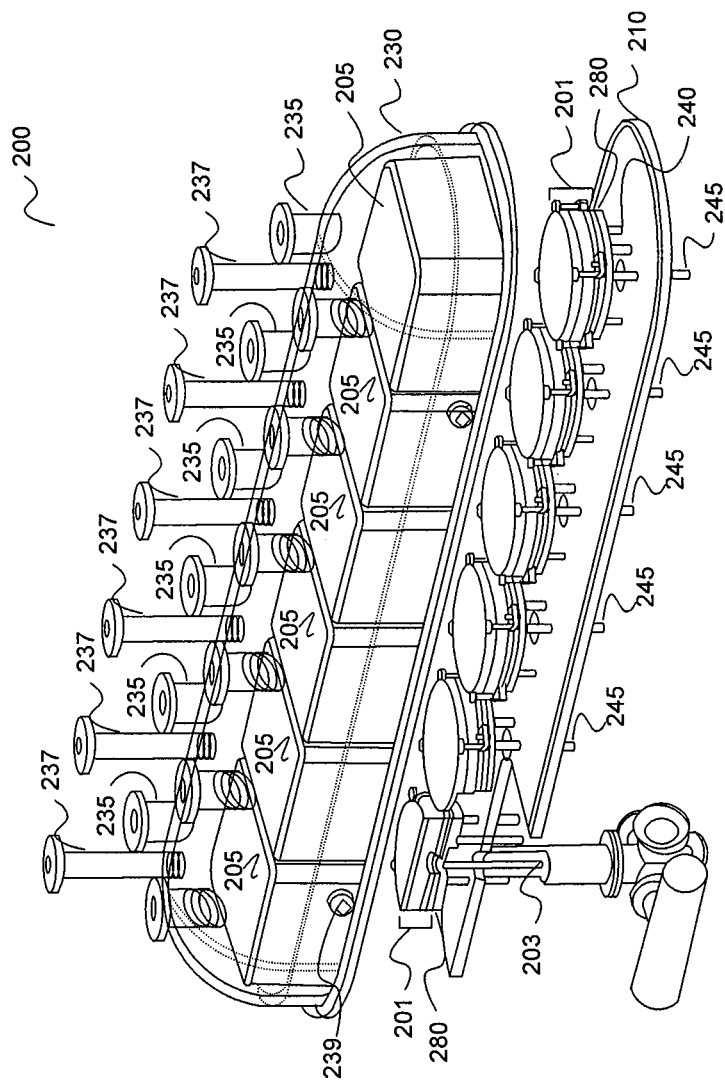
FIG. 2 illustrates an exemplary embodiment of a process chamber comprising a plurality of compartments and depicts a cross-sectional view of a substrate support structure.

As used herein, a "base" includes a device, apparatus or system capable of supporting the components of the process chamber. FIGS. 1 and 2 illustrate exemplary embodiments of process chamber 100/200 having base 110/210.

As used herein, a "top portion" includes a structure capable of attaching to the base for conducting CVI/CVD within. FIGS. 1 and 2 illustrate exemplary embodiments of process chamber 100/200 having top portion 130/230 attached to base 110/210. As shown, top portion 130/230 has dome-shaped ends. However, it will be understood that the top portion may be any desired shape.

In various embodiments, the weight of the top portion is used to form a seal with the base. Attachment means may also be used to removably attach the top portion to the base. For example, bolts, screws, clamps, pins, and the like may be used. A gasket or other sealing means may also be used to seal the top portion to the base.

The base and top portion portions are comprised of a suitably rigid material, such as steel, carbon, graphite, aluminum and/or the like. Moreover, the base and/or top portion may be jacketed to facilitate temperature control. Moreover, in various embodiments and as illustrated in FIG. 1, process chamber 100 may comprise one or more coolant ports 133 in cover portion 130 providing a coolant through the jacketed system.

In various embodiments, a process chamber comprises at least two process compartments. As used herein, a "process compartment" includes any structure capable of containing one or more substrates during CVI/CVD treatment. FIGS. 1 and 2 illustrate exemplary embodiments of process chambers 100/200 having a plurality of process compartments 105/205.

Each compartment may include its own set of controls and process equipment to allow independent control of the treatment conditions within. For example, the controllers and gauges may be operated via a single instrument, such as a feedback instrument. However, it will be understood that any number of controllers and/or gauges may be used.

Figure 3:
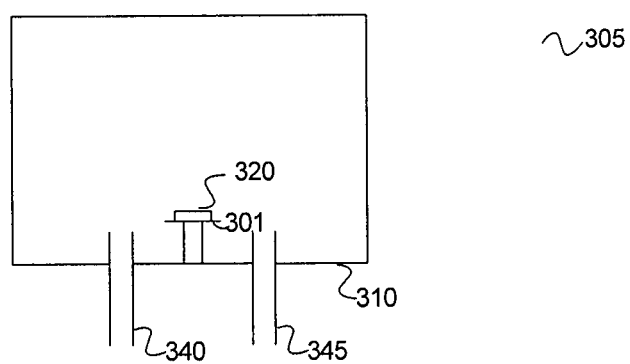
FIG. 3 illustrates an exemplary embodiment of a process compartment.

In an exemplary embodiment, each process compartment comprises a gas inlet. Although described herein as "a gas inlet," one skilled in the art will appreciate there may be one or more gas inlets in any of the embodiments. As used herein, a "gas inlet" includes a structure, device or system capable of delivering a gas to the interior of a process compartment. FIG. 3 illustrates gas inlet 340 operable to deliver a gas into process compartment 305 via base 310.

Figure 5:
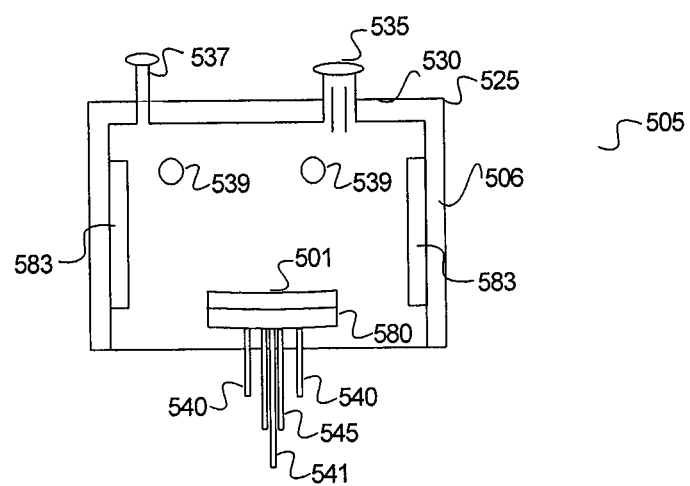
FIG. 5 illustrates an exemplary embodiment of an insulated process compartment.
Figure 6:
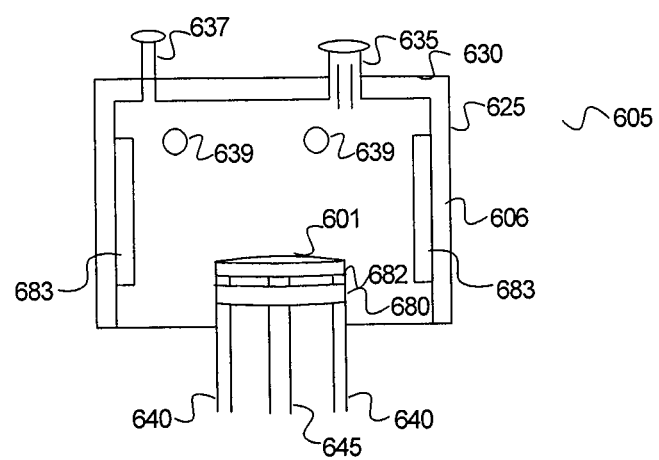
FIG. 6 illustrates an exemplary embodiment of an insulated process compartment having an adjustable cooling element.

Although FIG. 3 illustrates a single gas inlet 340, each process compartment may comprise any number of gas inlets. For example, FIGS. 5 and 6 illustrate process compartments 505/605 having two gas inlets 540/640, and FIG. 1 illustrates four gas inlets 140 per each process compartment 105. Each gas inlet 140 comprises a tube surrounding gas outlet 145, which delivers gas to the interior of process compartments 105. Although the gas inlets are depicted in the Figures as entering the process compartments via the base, the gas inlet may be located anywhere on the process compartment. Moreover, the gas inlet may be any desired length and/or diameter. In one embodiment, the length and/or diameter of the gas inlets are selected to control the flow of gas feed to the interior of the process compartment.

The gas delivered via the gas inlet may be any gas having one or more components capable of decomposing to form a solid residue on or within a substrate. In an exemplary embodiment, the gas comprises a reactant component and/or a carrier component.

The reactant component is a gas capable of forming a residue upon thermal decomposition. For example, when carbon is the desired residue (as in the formation of carbon/carbon composites), the reactant component may comprise one or more hydrocarbons. Suitable hydrocarbons includes such as straight chain, branched chain and/or cyclic alkanes. The alkane may have, for example, from about 1 to about 8 carbon atoms, and more specifically, from about 1 to about 6 carbon atoms, and more specifically, from about 1 to about 3 carbon atoms. Examples of alkanes include methane, ethane, propane, cyclopentane, or mixtures thereof. In other embodiments, the reactant component may comprise one or more alkenes, having for example, about 2 to about 8 carbon atoms, alone or in addition to one or more alkanes. In various embodiments, the reactant component comprises alkynes, such as acetylene. In various embodiments, the reactant component comprises a ceramic material.

The carrier component includes a gas suitable to carry and/or dilute the reactant component. In an exemplary embodiment, the carrier component may comprise hydrogen, nitrogen, helium, argon, or a mixture of two or more thereof. It will be understood that the carrier component may comprise any diluent and/or inert gases.

Figure 4:
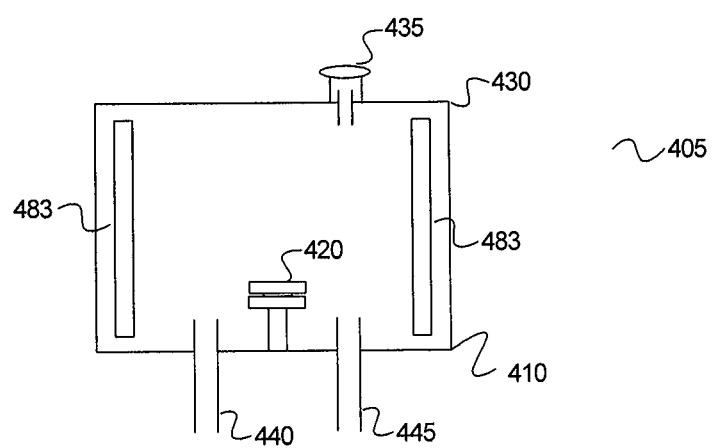
FIG. 4 illustrates an exemplary embodiment of a process compartment having heating and cooling elements.

In accordance with an exemplary embodiment, each process compartment may further comprise a gas outlet. As used herein, a "gas outlet" includes a structure, device or system capable of removing unreacted gas and/or by-product gases generated during the CVI/CVD process from the process compartment. FIGS. 2, 3, and 4 illustrate gas outlets 245/345/445 inserted into process compartments 205/305/405 and terminating at the bottom of base 210/310/410. However, it will be understood that the gas outlet may be positioned at other locations on the process compartment. Moreover, although FIG. 2 illustrates a single gas outlet, in other embodiments, the process compartment may comprise any number of gas outlets. Moreover, the gas outlet may be any desired length and/or diameter.

In accordance with an exemplary embodiment, the gas outlet is connected to a vacuum system or other suction means to facilitate the removal of the gas and/or alter the pressure within the compartment.

In various embodiments, the process chamber and/or each or a subset of process compartments may further comprise a heating element. As used herein, a "heating element" includes a device or structure that is in thermal communication with all or a portion of a substrate. As used herein, "thermal communication" refers to two bodies, for example, a heating source and the surface of a substrate or a cooling source and the surface of a substrate that may or may not be in physical contact with each other or adjacent to each other, but may still exchange heat with each other.

The heating element may comprise one or more electrodes, induction heating elements, transformers (such as induction coils), susceptors, resistance heating elements and/or microwave heating elements. It will be understood that any device or structure suitable to provide heat to all or a portion of the substrate may be used.

As shown in FIG. 4, each process compartment 405 has heating elements 483 positioned in thermal communication with substrate 420. Although heating elements 483 are located along the sides of process compartment 405 in FIG. 4, it will be understood that the heating elements may be located in any position suitable to provide heat to all or a portion of the substrate, such as the top.

In various embodiments, each process compartment may comprise one or more ports operable for accessing the heating elements. For example, FIGS. 4, 5 and 6 illustrate process compartment 405/505/605 having port 435/535/635 (i.e., an electrode nozzle) located in top portion 430/530/630.

In various embodiments, the process chamber and/or each process compartment or a subset of each process compartment further comprises a cooling element. As used herein, a "cooling element" includes any device, structure or method that cools all or a portion of a substrate. In an exemplary embodiment, the cooling element comprises chilled or superchilled gas that is provided to the interior of each process compartment via one or more gas inlets. In accordance with the exemplary embodiment illustrated in FIG. 5, cooling element 580 comprises a plate beneath substrate support structure 501 so as to be in thermal communication with the substrate. However, the cooling element may be located in any desired position so as to be thermally coupled with the substrate. For example, the cooling element may be thermally coupled to the bottom surface of the support plate. In other exemplary embodiments, all or part of the substrate support structure may act as the cooling element.

In an embodiment, the cooling element has one or more embedded cooling conduits or channels to allow fluid coolant to flow through the cooling element. Fluid coolants such as water, air, nitrogen, oil, and the like may be used. In one embodiment, the cooling element may comprise one or more gases.

Figure 11:
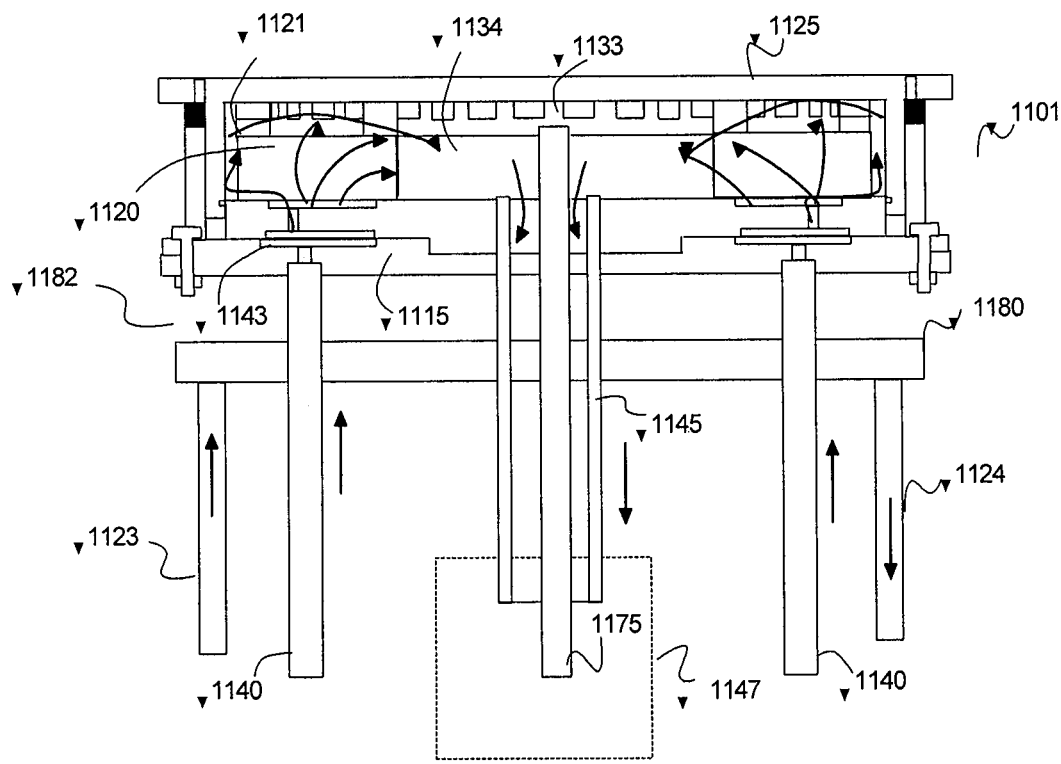
FIG. 11 illustrates an exemplary embodiment of an assembled substrate support structure and provides an exemplary schematic of the outer diameter (OD) and inner diameter (ID) flow of reactant gas within the substrate support structure.

In accordance with various embodiments, the position of the cooling element may be adjusted relative to the substrate support structure. The cooling element may be attached to one or more adjustable components of the process compartment such that movement of the components adjusts the position of the cooling element. For example, FIG. 11 illustrates one or more cooling media inlets 1123 and/or cooling media outlets 1124 connected to cooling element 1180, and the position of the cooling media inlet 1123 and cooling media outlet 1124 may be adjustable so as to simultaneously adjust the position of cooling element 1180.

As shown, lowering cooling element 1180 creates or increases interstitial space 1182 between cooling element 1180 and substrate support structure 1101. In an exemplary embodiment, the space may be filled with one or more insulation materials, which creates a barrier to decrease the cooling transfer from the cooling element to the substrate. Suitable insulation material such alumina, fiberglass, slag wool, mineral wool, rock wool, ceramic fibers and carbon fibers may be used. Moreover, the insulation material may be in any suitable form, such as beads, capsules, liquid, and/or the like.

In FIG. 6, process compartment 605 comprises cooling element 680 beneath substrate support structure 601 and heating elements 683 along the sides of process compartment 605. During operation of process compartment 605 during the CVI/CVD process, the bottom surface of the substrate contained within substrate support structure 601 is relatively cold and the top surface of the substrate is relatively hot, resulting in a thermal gradient across the thickness of the substrate.

In an embodiment, each process compartment may further comprise a substrate support structure. As used herein, a "substrate support structure" includes a device, apparatus, or system capable of supporting a substrate. For example, a substrate support structure may comprise a plate, disc or other platform. FIG. 3 illustrates an exemplary embodiment of process compartment 305 having substrate support structure 301 in the form of a plate for supporting substrate 320.

As used herein, a "substrate" includes a material capable of being treated by chemical vapor deposition and/or infiltration. In an exemplary embodiment, the substrate comprises a porous material having sufficient pore size and volume to permit a gas to infiltrate the pores under reaction conditions to form a solid residue therein as a result of thermal decomposition. Examples of suitably porous materials include, for example, carbon, silicon, boron, silicon carbide, silicon nitride, aluminum nitride, titanium nitride, boron carbide, cubic zirconia and the like, or a mixture of two or more thereof.

In accordance with various embodiments, the porous material is formed from a fibrous material, such as carbon fibers, ceramic fibers and the like. The carbon fibers may be derived from polyacrylonitrile, rayon (synthetic fiber derived from cellulose), pitch and the like. In an embodiment, the porous substrate is formed by twisting together or otherwise joining the fibers to form a fiber yarn. The yarn may is then woven, braided, knitted or otherwise joined into layers of fibrous material. These layers are then combined to form a porous substrate.

In other embodiments, the substrate comprises a substantially solid material. However, it will be understood that a substrate may comprise any material (whether porous or solid) that is capable of being treated by CVI and/or CVD.

The substrate may comprise any desired shape or form. For example, the substrate may be in the form of a polygon, such as a triangle, a square, rectangle, pentagon, hexagon, octagon, and the like. Similarly, the substrate may be other shapes, including symmetrical and asymmetrical shapes. In exemplary embodiments such as those described herein, the substrate may be in the form a circular or annular disk.

In an embodiment, the substrate undergoes treatment prior to the CVI/CVD process. For example, the substrate may be heated and/or pressurized (such as in a vacuum or an inert atmosphere). In an embodiment, the substrate is heated at a temperature in the range from about 1400 to about 2800° C., and more specifically, in the range from about 1600 to about 2200° C., for a period of time of about 60 hours. When the substrate comprises carbon or is formed using carbon fibers, this heat treating step may be referred to as a carbonizing step, and the heat treated substrate may be referred to as a carbonized substrate.

In accordance with various embodiments, the substrate support structure is operable to provide individual containment of a substrate during CVI/CVD treatment. For example, U.S. patent application Ser. No. 12/423,680 entitled SYSTEM AND METHOD FOR CREATING COMPOSITE STRUCTURES filed on Apr. 14, 2009, U.S. patent application Ser. No. 12/257,712 entitled PROCESS AND APPARATUS FOR MAKING COMPOSITE STRUCTURES (claiming priority to U.S. Ser. No. 60/982,807), and U.S. patent application Ser. No. 12/257,707 entitled COMPOSITE STRUCTURE (claiming priority to U.S. Ser. No. 60/982,788), which are all herein incorporated by reference in its entirety, disclose various CVI/CVD containment structures. For example, in various embodiments, the system and method described herein enables mass or larger scale production of the products made by the processes described in U.S. patent application Ser. No. 12/257,712.

Figure 7:
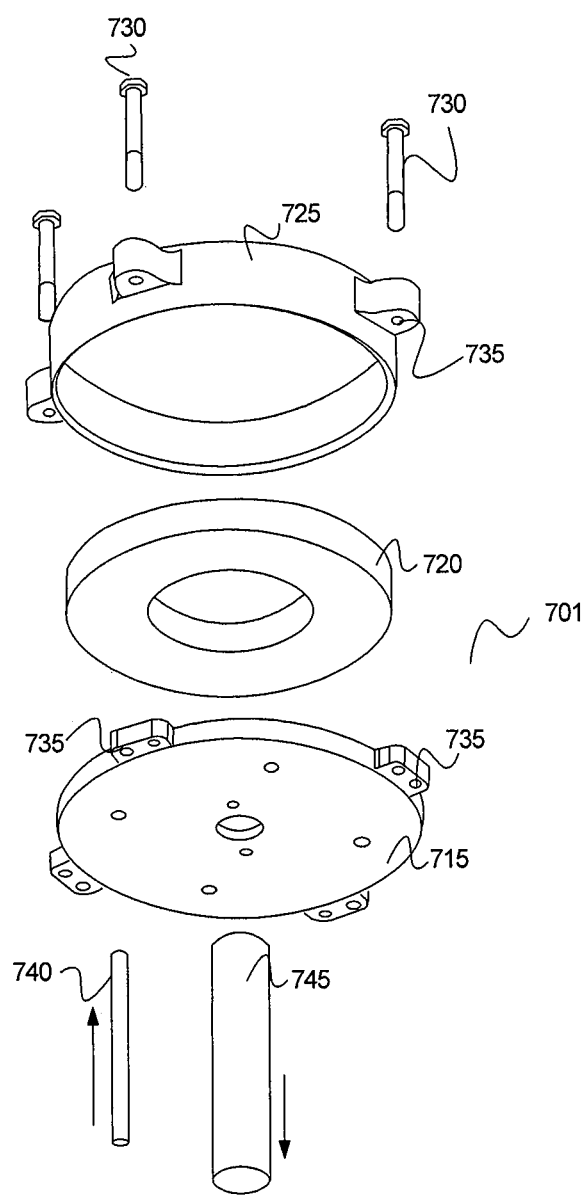
FIG. 7 illustrates an exploded view of an exemplary embodiment of a substrate support structure.

In an embodiment, a substrate support structure comprises a seat and a cover portion. As used herein, a "seat" includes a structure capable of supporting the components of a substrate support structure. FIG. 7 illustrates a substrate support structure 701 having seat 715. The seat may be permanently mounted within each process compartment or may be removably attachable.

As used herein, a "cover portion" includes a structure capable of removably attaching to the seat to create a compartment for containing a substrate within. In an embodiment, the cover portion comprises an attachment means such as bolts, screws, pins, and/or the like to suitably mate with the seat. For example, FIG. 7 illustrates a substrate support structure 701 having seat 715 and cover portion 725 which is removably attached together to secure substrate 720 within. The attachment means comprises bolt 730 which may be inserted into openings 735 on seat 715 and cover portion 725.

Figure 8:
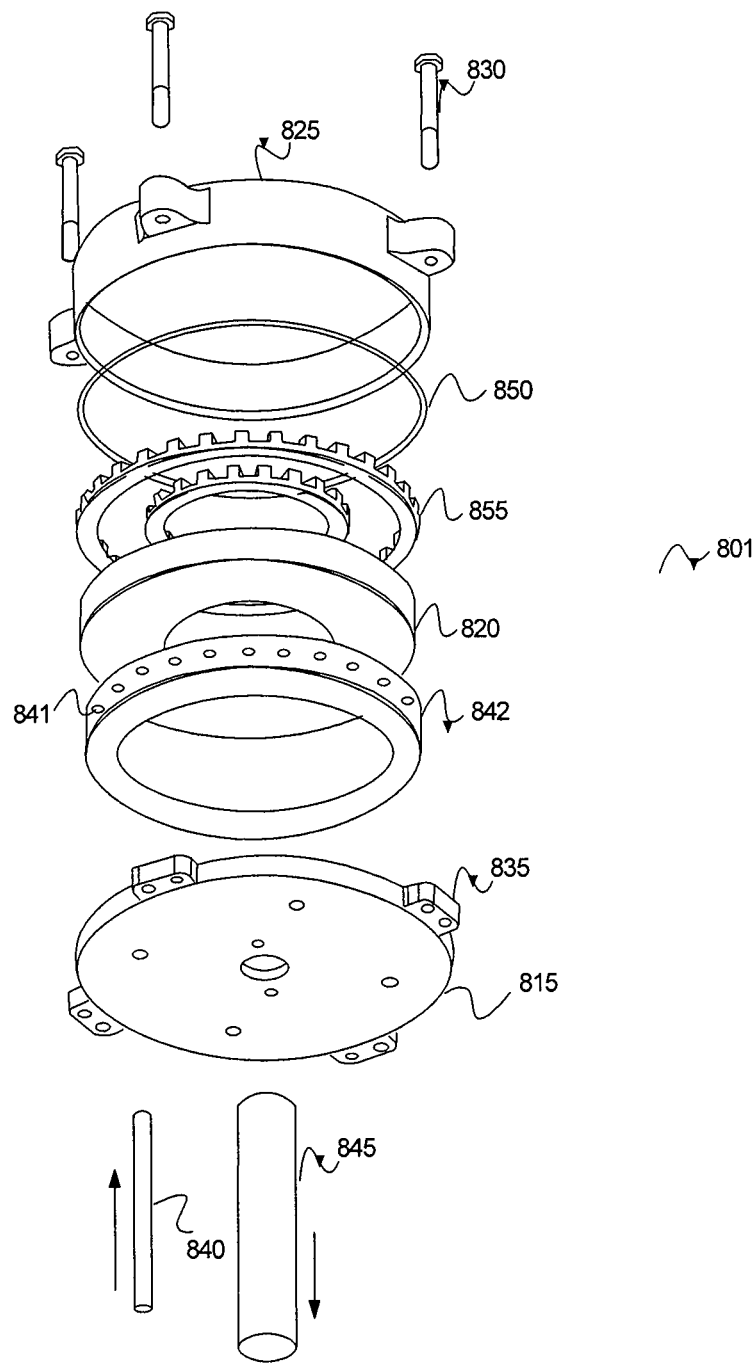
FIG. 8 illustrates an exploded view of an exemplary embodiment of a substrate support structure.
Figure 9A:
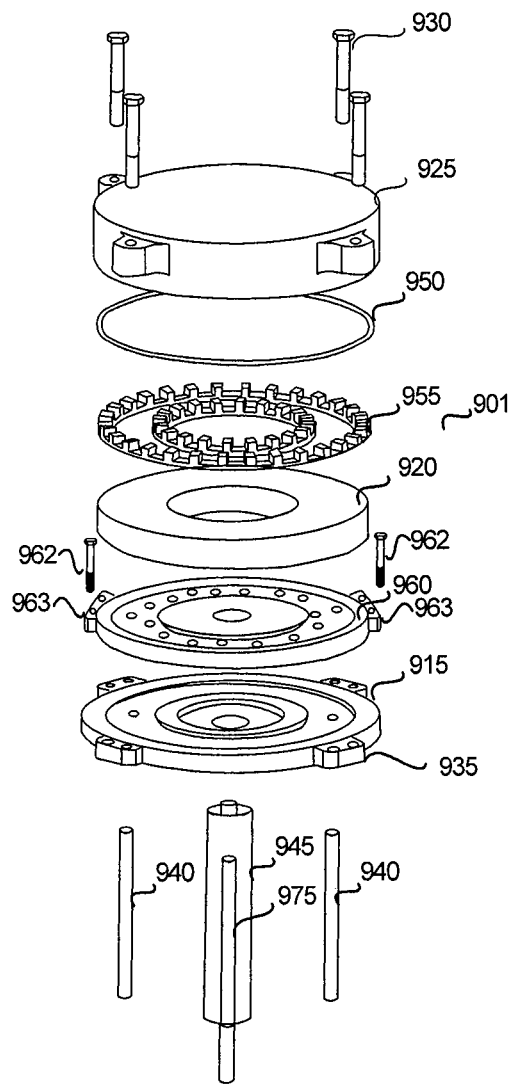
FIGS. 9A and 9B illustrate exploded views of an exemplary embodiment of a substrate support structure.
Figure 9B:
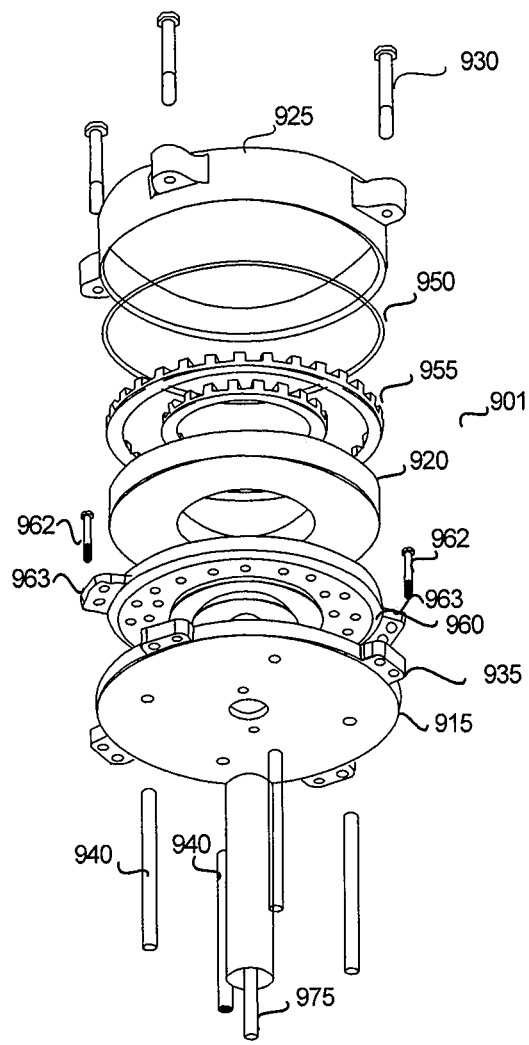

In an embodiment, the upper edge of the seat may be stepped radially inward to facilitate attachment of the cover portion. In various embodiments, the upper edge of the seat may have a groove, twist-lock mechanism, ribbing, threads and/or clamps to facilitate the cover portion being snapped, screwed, twisted, clamped, and/or otherwise attached onto the seat. As shown in FIGS. 8, 9A and 9B, cover portion 825/925 may further comprise attachment means 830/930 operable to mate with receiving means 835/935 located in seat 815/915. Any known or hereinafter devised structure or means of attaching cover portion to the seat may be used.

In an embodiment, the seat, the substrate and the cover portion are assembled to define a first open space between the seat and the substrate and a second open space between the cover portion and the substrate.

In an embodiment, the shapes of the seat and/or the cover portion conform substantially to the shape of the substrate. Moreover, the seat and cover portion may be bigger than the substrate to contain the substrate within. FIG. 7 illustrates seat 715 and cover portion 725 having a substantially circular shape to conform to the circular periphery of substrate 720. However, it will be understood that the seat and cover portion may be any desired size and/or shape.

As shown in FIGS. 7, 8, 9A and 9B, gas inlet 740/840/940 and gas outlet 745/845/945 of the process compartment may be connected directly to seat 715/815/915 to deliver and remove gas from the substrate support structure 701/801/901. As shown, gas outlet 745/845/945 is located substantially in the center of seat 715/815/915, but it may be in any desired location.

In accordance with an exemplary embodiment, a substrate support structure may further comprise a seal component. As used herein, a "seal component" includes any device, structure or system that creates a seal between two or more components of the substrate support structure. Exemplary embodiments of the seal component may comprise suitable materials for creating a seal, such as graphite, metals, polymeric materials, and the like. In some embodiments, the material is configured so that it does not swell or distort due to temperature or pressure change.

In accordance with the exemplary embodiment shown in FIGS. 8, 9A and 9B, seal component 850/950 comprises a ring operable to be positioned between co ver portion 825/925 and seat 815/915. It will be understood that the seal component may be omitted, or one or more seal components may be placed at any desired position(s) within the substrate support structure.

Moreover, the seal component may be formed separately from the substrate support structure and then mounted to the substrate support structure, or may be formed integrally with the substrate support structure.

In accordance with an embodiment, a substrate support structure may further comprise one or more spacer components. As used herein, a "spacer component" includes any device or structure which creates a space between one or more components of the substrate support structure. In an embodiment, the spacer component is smaller than the cover component to fit within the cover component when the substrate support structure is assembled. In an embodiment, the spacer component is sized to fit the substrate.

In an embodiment, such as that shown in FIGS. 8, 9A and 9B, spacer component comprises concentric castellated rings 855/955 located between cover portion 825/925 and substrate 820/920 to create a space in the upper half of assembled substrate support structure 801/901. However, it will be understood that one or more spacer components may be positioned at any desired position(s) within the substrate support structure. For example, a spacer component may be located between the seat and the substrate to create a space in the bottom half of the assembled substrate support structure.

A containment structure may further comprise a gas bypass component. As used herein, a "gas bypass component" includes any device, apparatus, and/or system operable to provide a gas bypass or leakage between two or more components of the containment structure. In one embodiment, the gas bypass component comprises a ring device having openings to allow the gas to transfer between components of the containment structure. In various embodiments, the openings extend in the radial direction along the gas bypass component. However, it will be understood that the openings may be arranged in any suitable orientation and/or configuration.

In an embodiment, the gas bypass component is positioned between the substrate and the diffuser plate at the outer diameter (OD) of the containment structure. Openings in the gas bypass component allow gas bypass between the first and second open space of the containment structure.

Figure 10:
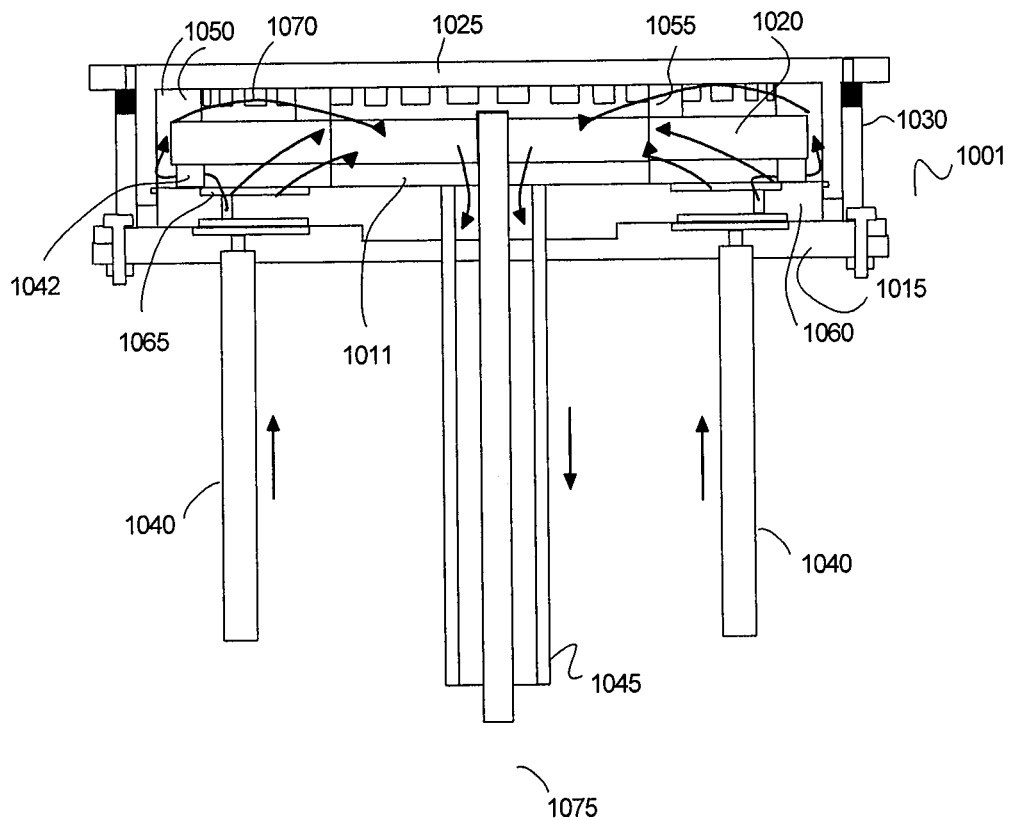
FIG. 10 illustrates an exemplary embodiment of an assembled substrate support structure.

For example, FIGS. 8 and 10 illustrate exemplary gas bypass components 842/1042 operable to allow gas to flow to the outer diameter of the substrate. In various embodiments, and as illustrated in FIG. 8, openings 841 extend in the radial direction along gas bypass component 842. However, it will be understood that the openings may be arranged in any suitable orientation and/or configuration. In various embodiments and as illustrated in FIG. 10, containment structure 1001 may further comprise ID support 1011 to raise substrate 1020 to the level of gas bypass component 1042.

A substrate support structure may further comprise a diffuser component. As used herein, a "diffuser component" includes a device or structure suitable to disperse gas entering the substrate support structure. FIGS. 9A and 9B illustrate an exemplary diffuser component 960 positioned between seat 915 and substrate 920. Diffuser component 960 is attached to seat 915 using bolts 962 and reception means 963. It will be understood that the diffuser component may have any desired number and size openings which suitably allow the reactant gas to pass to the substrate.

It will also be understood that the seat, cover portion, spacer component, seal component, diffuser component and other components of the substrate support structure may comprise sufficiently rigid material, such as ceramics and metals (including carbon, steel, iron, or combinations thereof), and/or the like and in the exemplary embodiments described herein are comprised of carbon.

In an embodiment, the substrate support structure comprises a device or mechanism for actively cooling a surface of the substrate. For example, FIGS. 9A, 9B and 10 illustrate substrate support structure 901/1001 comprising conduit 975/1075 within gas outlet 945/1045, which allows a cool gas, such as nitrogen, to be piped up to the top surface of the substrate to increase the cool down rate. The gas is then drawn back down through gas outlet 945/1045. In one embodiment, the gas inlet may be used as a cooling conduit that can be used to cool the substrate. For example, cool nitrogen or other gas may be provided to the interior of the substrate support structure to cool the system. In various embodiments, deflection plates may be inserted in the top portion of the substrate support structure to facilitate cool down of the substrate. It will be understood that any device or mechanism for cooling the top surface of the substrate may be used.

In an embodiment, the conduit further comprises instrumentation to measure the temperature and/or pressure of the gas in the space above the substrate. For example, FIG. 5 illustrates pressure measurement device 541 located within gas outlet 545. Moreover, although located within the gas outlet in FIG. 5, the conduit may be located in any desired position relative to the substrate support structure.

FIG. 10 illustrates an embodiment of an assembled substrate support structure. As shown, diffuser component 1060 is positioned on seat 1015 to create first open space 1065 to permit the reactant gas to flow from gas inlets 1040 in to contact with substrate 1020, which is positioned on top of diffuser component 1060. Spacer component 1055 rests on top of substrate 1020 and contacts cover portion 1025 to create second open space 1070 to allow the reactant gas to escape from substrate 1020 and exit substrate support structure 1001 via gas outlet 1045. Cover portion 1025 is coupled to seat 1015 via attachment means 1030.

In an embodiment, the size of second open space 1070 is minimized so as to reduce the amount of time the expelled reactant gas remains within substrate support structure 1001. However, it will be understood that the second space may be any desired size.

In accordance with various embodiments, the diffuser component, substrate, spacer component, seal component, and/or the cover component are assembled prior to attachment to the support component. Moreover, the components may be assembled prior to insertion in the process compartment. In an embodiment, the components are stacked sequentially onto the seat in the process compartment prior to attachment of the cover portion.

FIG. 11 illustrates an embodiment of the flow of reactant gas within a substrate support structure. As shown, the reactant gas enters substrate support structure 1101 via gas inlets 1140. The reactant gas disperses in first open space 1143 located between seat 1115 and annular substrate 1120. The reactant gas infiltrates substrate 1120 and deposits a solid matrix within the pores. The excess reactant gas and any byproduct gases are released through the top, inner diameter (ID) 1134 and outer diameter (OD) 1121 of substrate 1120 into second open space 1133 in cover portion 1125. The gases that do not undergo thermal decomposition (i.e., the unreacted gases), as well as any by-product gases that may be generated during the process flow through the substrate, through the relatively hot surface and out of gas outlet 1145. Optionally, vacuum component 1147 facilitates removal of the excess reactant gas and byproducts from the system.

As the process continues, the build up of solid residue within the substrate may result in the gradual densification of substrate 1120 and the formation of the composite structure.

The densification generally proceeds from the hot side of the substrate to the cold side of substrate 1120. For example, the top layer of the substrate reaches the reaction-critical temperature, resulting in the formation of the binding matrix. In accordance with an exemplary embodiment, in response to the desired amount of binding matrix being deposited in the top portion of the substrate, the cold plate may be adjusted downward relative to the substrate support structure, causing the next portion of the substrate to reach the critical temperature and deposition to occur, and so on.

In accordance with an exemplary embodiment, each process compartment is insulated. For example, FIGS. 5 and 6 illustrate process compartment 505/605 comprising insulation 506/606. Suitable types of insulation include, for example, composite carbon rigid board (CRB), graphite rigid board, ceramic materials, refractory materials such as alumina, and the like. In an exemplary embodiment, the insulation is attached to the top portion of the process compartment. In other embodiments, the insulation may be separate from the top portion of the process compartment. The insulation may be any desired thickness. In an exemplary embodiment, the insulation is between about 2 to about 4 inches thick.

In various embodiments, each process compartment may comprise additional components such as one or more cleaning ports and temperature and/or pressure measurement devices. FIGS. 5 and 6 illustrate process compartment 505/605 comprising pyrometer nozzle 537/637 to measure temperature and cleaning ports 539/639, and FIG. 11 illustrates gas outlet 1145 comprising a pressure measurement tube 1175. In an embodiment, one or more gas feed lines 1140 may be used to measure pressure within the system.

Referring again to FIGS. 1 and 2, process chambers 100/200 comprise a plurality of compartments 105/205. Each compartment 105/205 is operable to contain a substrate support structure 101/201. Gas inlets 140/240 are operable to deliver gas to the interior of substrate containment structures 101/201, and gas outlet 145/245 removes excess gas. Each compartment 105/205 may be insulated, and may have its own cooling element 180/280, heating element, shown as an electrode nozzle 135/235 for use with an electrode (e.g., a carbon or copper electrode), pyrometer nozzles 137/237 and cooling media outlets 133. As shown in FIG. 2, gas outlets 245 may comprise pressure measurement tube 203 for measuring pressure within the substrate containment structures 201. The process compartments also have ports 139/239 operable to flush out the cooling jacket.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are Intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A system for densifying a substrate comprising:
    a base;
    a top portion operable to removably attach to the base;
    at least two process compartments each comprising:
        a substrate support structure comprising at least one of a first plate, a disc, or a platform;
        a first gas inlet operable to deliver a gas to the substrate support structure, the first gas inlet disposed on a bottom surface of the substrate support structure;
        a second gas inlet operable to deliver the gas to the substrate support structure, the second gas inlet disposed on the bottom surface of the substrate support structure,
        a gas outlet operable to remove the gas from the substrate support structure, the gas outlet disposed on the bottom surface of the substrate support structure, the gas outlet disposed in between the first gas inlet and the second gas inlet;
        a cooling element positioned beneath and in thermal communication with the substrate support structure, the cooling element having an embedded cooling conduit to allow a fluid coolant to flow through the cooling element, the cooling element being thermally coupled to the bottom surface of the substrate support structure, wherein the cooling element comprises a second plate having a surface in thermal communication with the substrate support structure, said surface extending horizontally in a first direction, a position of the cooling element being adjustable with respect to the substrate support structure so as to increase or decrease an interstitial space between the position of the cooling element and the substrate support structure;
        the first gas inlet, the second gas inlet, and the gas outlet extending vertically in a second direction from below the surface of the second plate to a location above the surface of the second plate of the cooling element, and
        heating element in thermal communication with the substrate support structure, the heating element including at least one of an induction heater, a susceptor, a resistance heater, an electrode, or a microwave heater,
    wherein the top portion defines a volume within which resides each of the at least two process compartments.

2. The system according to claim 1, further comprising at least one of a cleaning port, an electrode nozzle or a pyrometer nozzle.

3. The system of claim 1, wherein the substrate support structure further comprises a cover portion operable to be removably attached to the substrate support structure so as to contain the substrate, wherein the cover portion includes a wall extending axially to enclose the outer diameter of the substrate;
    wherein, as assembled, the substrate support structure and the substrate define (1) a first open space between the support structure and the substrate; and (2) a second open space between the cover portion and the substrate.

* * * * *